United States Patent [19]

Yeh et al.

[11] 4,375,643

[45] Mar. 1, 1983

[54] APPLICATION OF GROWN OXIDE BUMPER INSULATORS TO A HIGH-SPEED VLSI SASMESFET

[75] Inventors: Keming W. Yeh, Los Angeles; Izya Bol, Hawthorne, both of Calif.

[73] Assignee: Xerox Corporation, Stamford, Conn.

[21] Appl. No.: 121,622

[22] Filed: Feb. 14, 1980

[51] Int. Cl.³ .................... H01L 21/265; H01L 29/56
[52] U.S. Cl. ........................................ 357/15; 357/22
[58] Field of Search .............................. 357/15, 22, 50

[56] References Cited

U.S. PATENT DOCUMENTS 3,668,481  6/1972  Saltich et al. ......................... 357/15
4,263,605  4/1981  Christou et al. ...................... 357/22

FOREIGN PATENT DOCUMENTS 2824026 12/1979  Fed. Rep. of Germany ........ 357/22

OTHER PUBLICATIONS

Field, R. K., "Picosecond Diode Takes a 450-Volt Jolt", *Electronic Design*, Oct. 25, 1967, pp. 40; 42.

Primary Examiner—R. A. Rosenberger

[57] ABSTRACT

A semiconductor structure and particularly a high-speed VLSI self-aligned Schottky Metal Semi-Conductor Field Effect Transistor having a relatively high operating frequency and low series resistance, predicated upon very controllable small structure geometries made by the growth of oxide bumper insulators on either side of the schottky barrier. The oxide bumpers width is relatively thicker than the depth of the initial silicon dioxide layer on the substrate surface thereby providing effective separation of the gate from the source and drain respectively. Accordingly, spatial separations between the self-aligned gate-and-drain and gate-and-source can be relatively very closely controlled by varying the doping level of an intermediate polysilicon layer thereby providing controllable differential polysilicon oxidation rates for the bumpers. Thus, the series resistance can be controlled to be relatively low thereby providing a VLSI SASMESFET device that can be operated at relatively high speeds.

3 Claims, 15 Drawing Figures

"APPLICATION OF GROWN OXIDE BUMPER INSULATORS TO A HIGH-SPEED VLSI SASMESFET"

CROSS REFERENCE TO A RELATED APPLICATION

An application entitled "Self-Aligned Schottky Metal Semi-Conductor Field Effect Transistor With Buried Source and Drain" bearing U.S. Ser. No. 122,627 and filed on Feb. 19, 1980 by one of the present inventors, Izya Bol, which is assigned to the same assignee as the present patent application, which discloses and claims a SASMESFET invention with spatial drain-to-gate and source-to-gate separations in the Y-coordinate.

BACKGROUND OF THE INVENTION

1. Field of the Invention

The present invention relates to the structure and process for making semi-conductor devices and particularly self-aligned Schottky metal semi-conductor Field Effect Transistors (SASMESFET).

2. Prior Art

In the past, SASMESFET's were accomplished by an etching step that defined source-drain-gate separations as described in the IEEE proceedings Vol. 59, pp. 1244-5, August 1971, or facet-growth where epitaxial growth defined the channel as described in U.S. Pat. No. 3,943,622, March 1976. Both of the above, even with the use of self-aligning as in the former case, use processes that are relatively difficult to control thus structure geometries approaching anything like VLSI cannot be very small without sacrificing yield. Also, the operating frequency is not as high and series resistance is not as relatively low as might be desired. As such, there existed a need for a high-speed SASMESFET structure and process therefore that was process controllable at the desired relatively high operating frequency and low series resistance yet have a reasonable yield in mass quantities.

SUMMARY OF THE INVENTION

It is thus an important object of the invention to provide a high-speed VLSI Self-Aligned Schottky metal semi-conductor Field Effect Transistor having a relatively high operating frequency and low series resistance.

It is a further important object of the invention to provide a high speed, self-aligned Schottky Metal Semi-Conductor Field Effect Transistor having relatively small structure geometries that are minimal as to gate length, gate-to-source separation and gate-to-drain separation, in the X-coordinate, that are process controllable at relatively high yields.

It is yet another important object of the invention to provide oxide bumper insulators that are grown on either side of the Schottky gate for minimal separation from the drain and source while being very process controllable in high yields thereby allowing relatively small structure geometries without causing short circuiting or unduly high series resistance therebetween.

It is yet another further important object of the invention to provide a strictly controllable means of varying the space separations as between the source-to-gate and drain-to-gate by varying the relative doping level of an intermediate polysilicon film over the Schottky gate used to help form the oxide bumpers used as insulators thereby giving differential oxidation rates therefore for minimal lateral distance between the Schottky gate and the source/drain areas.

It is yet but another further important object of the invention to provide the silicon dioxide bumpers or insulators for the SASMESFET with a width relatively spatially larger than the depth of the initial silicon dioxide or substrate oxide formed over the substrate of the SASMESFET because the differential oxide growth rate for the relatively heavily doped polysilicon layer is relatively greater than the relatively undoped silicon substrate for a very controllable low series resistance.

BRIEF DESCRIPTION OF THE DRAWINGS

Various other objects, advantages and meritorious features of the invention will become more fully apparent from the following specification, appended claims and accompanying drawing sheets.

The features of a specific embodiment of the invention are illustrated in the drawings in which.

BRIEF DESCRIPTION OF THE PREFERRED EMBODIMENTS

Figure 1:
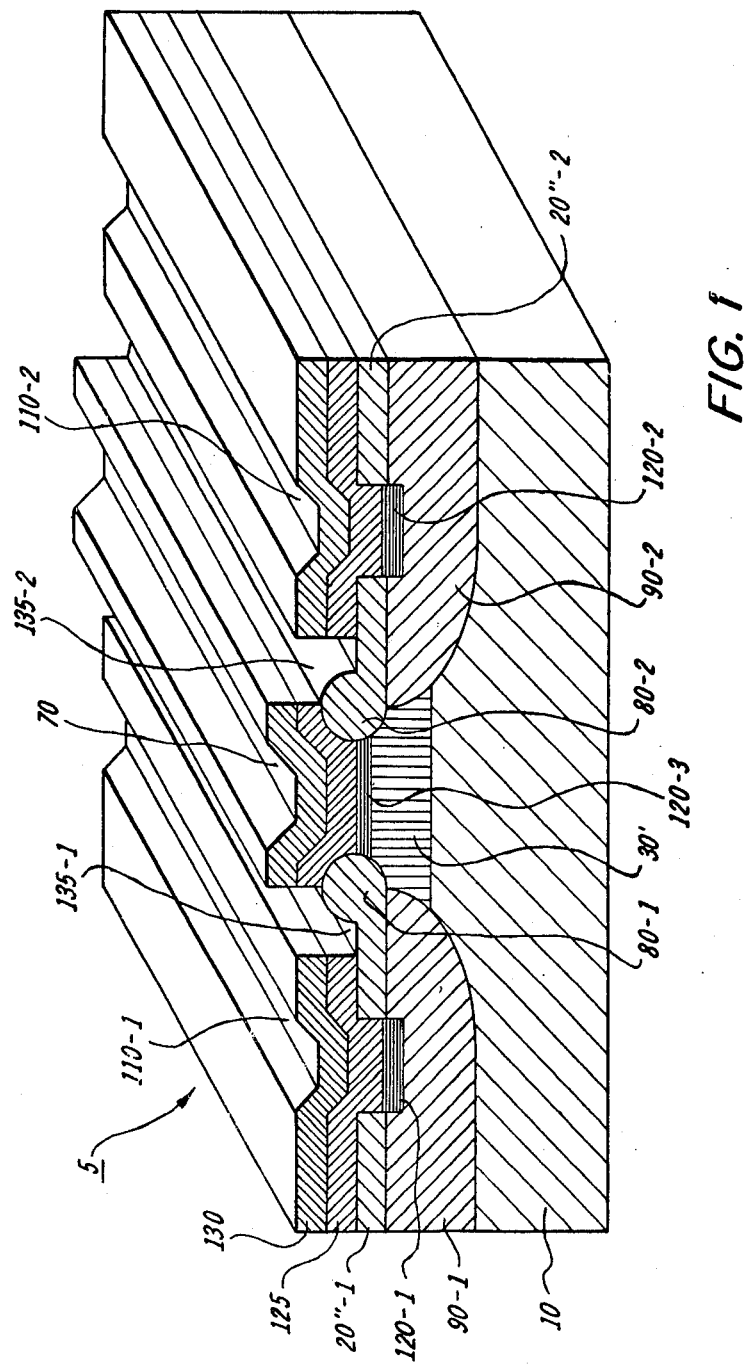
FIG. 1 is a perspective profile view of the SASMESFET structure of the invention.
Figure 2:
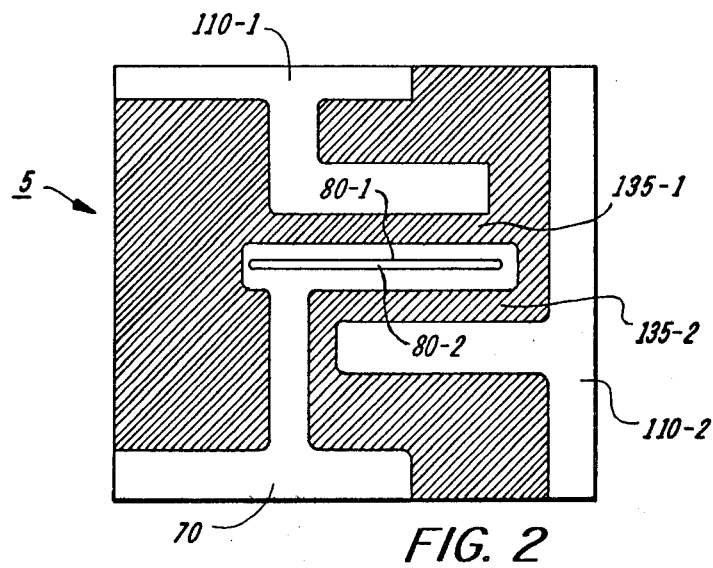
FIG. 2 is an overhead view of the SASMESFET structure of FIG. 1.

Referring to FIGS. 1 through 4L by the characters of reference, there is illustrated an apparatus for carrying out the objects of the invention. In the preferred embodiment of the invention as shown in FIG. 1, there is a perspective profile view of a high speed VLSI Self-Aligned Schottky Metal Semi-Conductor Field Effect Transistor (SASFET) or SASMESFET structure 5. It is also known as a self-aligning gate field effect transistor (SAGFET) or SAGMESFET. The structure 5 is formed on a substrate 10 preferably a semi-insulating silicon that is slightly P doped with boron. Source and drain areas have been implanted in the substrate 10 at 90-1 and 90-2 respectively. A channel area has been implanted between source and drain areas 90-1 and 90-2 at 30'. Initial or source and drain substrate oxide layers have been grown on the substrate 10 over the to be defined source and drain areas at 20"-1 and 20"-2. At the source and drain windows 110-1 and 2, platinum-silicide (PtSi) ohmic contacts 120-1 and 120-2 have been formed therein adjacent to the substrate 10 respectively. The PtSi contact 120-3 is a Schottky barrier for the Schottky gate area 70. Over the PtSi contacts 120-1, 120-2 and 120-3, a Titanium-Tungsten (TiW) layer 125 and a successive Aluminum (Al) are deposited. Etched away areas 135-1 and 135-2, down to the initial silicon dioxide layer 20"-1 and 20"-2, have been formed to electrically separate the source contact/window area 110-1 from the gate area 70 and the drain contact/window area 110-2 from the gate area 70 respectively.

Insulators or oxide bumpers 80-1 and 80-2 are formed over the substrate 10 as adjuncts to the initial oxide layers 20"-1 and 20"-2 respectively and are proximate to the Schottky gate area 70. The overhead or top view of FIG. 2 of the SASMESFET structure 5 shows the oxide bumpers 80-1 and 2 as in being connected in an elongated ellipse type configuration in the Schottky gate area 70, but it will be appreciated that they need not be connected or shaped as shown to effect the present invention.

Figure 3:
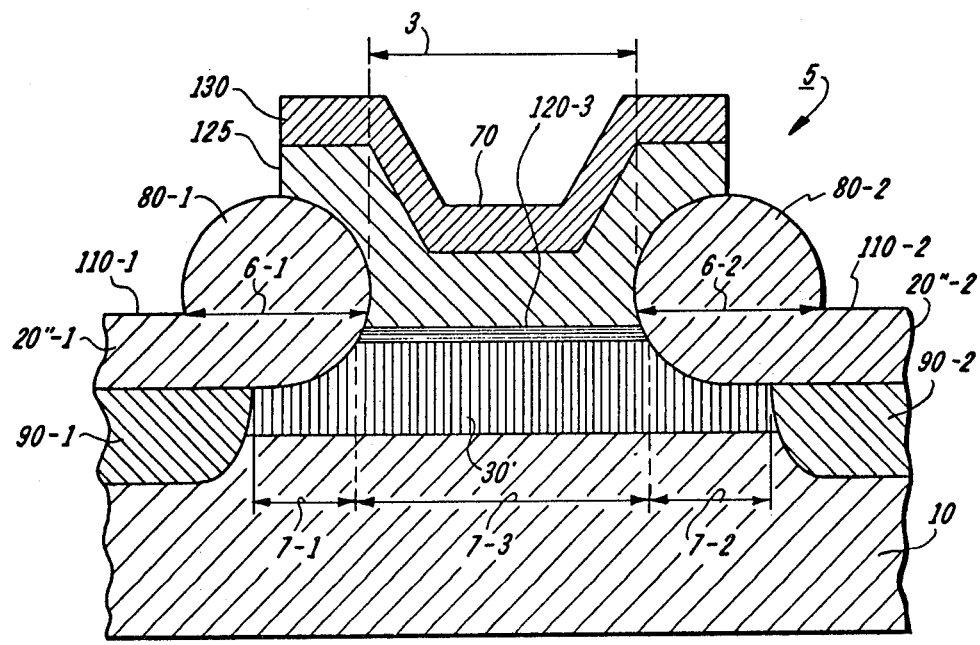
FIG. 3 is an expanded profile view of the silicon dioxide bumpers of the SASMESFET structure of FIG. 1.

It will be appreciated that high speed applications of this type of structure 5 requires very small geometries therefore gate length 7-3, as well as source to gate 7-1, and gate to drain 7-2 spatial dimensions in FIG. 3 should be minimized.

In this embodiment, gate or channel length down to 1 micrometer have been realized which is VLSI scale using conventional photo-patterning techniques. It will be appreciated that with Electron Beam lithographic techniques, the gate or channel length 7-3 could be brought down to relatively considerably less than 1 micron. At the same time, source to gate 7-1 and gate to drain 7-2 spatial space separations should be sufficient enough to prevent low voltage (LV) breakdown or short circuiting (SC). Because of the tradeoff requirement, the self-aligned structure 5 as used here is the most suitable. It is compatible with MOS-VLSI isoplanar processes.

In the prior art, Schottky Gate Field Effect Transistors have been accomplished by different methods which use either an etching step, as described in IEEE proceedings, Vol. 59, pp. 1244–5, August 1971, or facet-growing as described in U.S. Pat. No. 3,943,622, issued March 1976. Both of the supra prior art examples, even with self-alignment, use processes which are difficult to control which is the crux of problem that the present invention has solved. In the supra first prior art example, it is the etching step with self-aligning that defines source-date-grain separation.

In the supra second prior art example, it is the epitaxial growth that defines the channel. In the present invention, in addition to the use of self-alignment, source to gate separation 7-1 and drain to gate separation 7-2 are, as shown in FIG. 3, reached by the growing of the supra mentioned oxide bumpers or insulators 80-1 and 80-2. The spatial separation of source to gate 7-1 and drain to gate 7-2 can be varied by relatively incrementing or decrementing the doping level and thickness of the polysilicon layer 40' as shown in FIG. 4F which gives different oxidation rates for the polysilicon layer 40'. Because of the differences in the oxide growth rate between the relatively heavily doped polysilicon layer 40' and the relatively undoped silicon substrate 10, the width 6-1 and 6-2 of the so called bumpers 80-1 and 2 as shown in FIG. 3 will be spatially larger than the thickness of the oxidized silicon or initial silicon dioxide layers 20"-1 or 20"-2.

It will be appreciated that total series resistance Rs has two summed components. Mainly, source-to-gate series resistance Rs (S-G) measured across 7-1, and drain-to-gate series resistance Rs (D-G) measured across 7-2. Thus because the grown oxide bumpers 80-1 and 80-2 can be controlled very closely as during their formation as indicated supra, the distances 7-1 and 7-2 can be made relatively small without causing an unacceptable degree of short circuiting that would lower yield. Thus, if the distances 7-1 and 7-2 are relatively small, then total Rs is relatively small. It follows than transconductance is relatively high as is the directly proportional operating frequency. Thus, it is possible to build a relatively high speed SASMESFET with low series resistance, and have VLSI dimensions using conventional photopatterning all due to the precise controllability of the process particularly in regards to the growing of the oxide bumper insulators in the present invention.

The advantages of the structure and the fabrication process therefore of the present invention utilizing the bumpers 80-1 and 2 that utilize a process that is relatively easy to control the making thereof are that relatively very small structure geometries may be obtained resulting in a minimizing of gate length, gate-to-drain separation and gate-to-source separation thereby resulting in relatively high speed operation for the SASMESFET structure 5.

In the controllable process for fabricating the type of MESFET (metal-semiconductor FET) known as a SAGMESFET (self-aligning gate FET) or Self-Aligned Schottky Metal Semi-Conductor Field Effect Transistor (SASMESFET) Structure 5, there are twelve major steps in the preferred embodiment. It will be appreciated that either N doped/channel logic as in the present case or P doped/channel logic may be used to obtain the result in the present invention. It will be further appreciated that the dimensions and tolerances used in the present embodiment are exemplary and may be modified within reasonable limits without detracting from the present invention. The infra described twelve major steps are shown in FIG. 4A-L respectively.

Figure 4A:
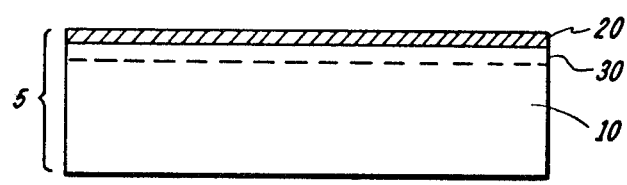
FIG. 4A is a profile view of the initial oxidizing step one of the process used to fabricate the SASMESFET structure of FIG. 1.

In the first major process step known as initial oxidizing as shown in FIG. 4A of the preferred embodiment for the SASMESFET structure 5, a silicon substrate 10 lightly p doped with boron is supplied. The substrate 10 may be a single crystal semi-conductor such as a silicon body or epitaxial layer such as silicon on sapphire (SOS). In a first substep, four to five hundred angstroms of initial silicon dioxide (SiO$_2$) or substrate oxide 20 is grown over and disposed on the top layer of the p doped silicon substrate 10. The initial oxide step is optional to the present invention as will be seen infra. It will be appreciated that an N doped silicon substrate 10 could have been used in reverse logic. In a second substep, an N channel 30 is implanted, under the initial oxide 20 and in the top portion of the P doped silicon substrate 10, using arsenic (As), in the preferred embodiment. It will be appreciated that the predetermined energy and dosage level of arsenic for the channel ion implant 30 across the surface of the substrate 10 was sufficient to form a gate implant-enhancement device of the structure 5. If a depletion device is desired for the structure 5, then an additional predetermined dosage of arsenic is given for the channel implant 30 again particularly in the infra described gate area as substep three. It will be further appreciated that the gate will be defined precisely in an infra step.

Figure 4B:
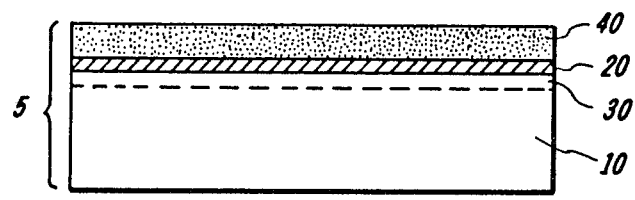
FIG. 4B is a profile view of the polysilicon depositing step two of the process used to fabricate the SASMESFET structure of FIG. 1.

In the second major process step known as polysilicon depositing as shown in FIG. 4B for the SASMESFET structure 5, a polysilicon layer or film 40 is deposited, as a first substep, over and disposed on the initial oxide layer 20 of the silicon substrate 10 to a variable depth of 2500 to 3000 angstroms. As a second substep, phosphorous (P), in the preferred embodiment, is diffused into the deposited polysilicon layer 40.

Figure 4C:
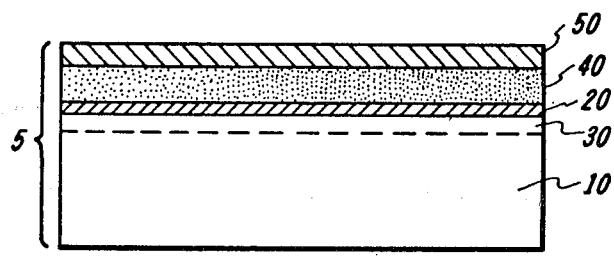
FIG. 4C is a profile view of the silicon nitride depositing step three of the process used to fabricate the SASMESFET structure of FIG. 1.

In the third major process step known as silicon nitride depositing as shown in FIG. 4C for the SASFET 5, a layer or film of silicon nitride ($Si_3N_4$) 50 is deposited, as the only substep, over the phosphorous diffused polysilicon layer 40 of the silicon substrate 10 to a variable depth of 800 to 1000 angstroms.

Figure 4D:
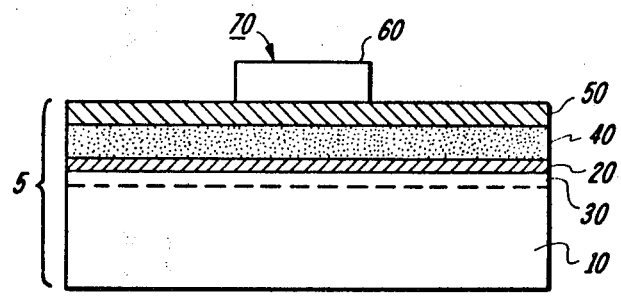
FIG. 4D is a profile view of the first photopattern defining step four of the process used to fabricate the SASMESFET structure of FIG. 1.

In the fourth major process step known as photopattern defining, as shown in FIG. 4D, for the structure 5, using electron beam lithography or conventional photopatterning techniques are implemented, as the only substep, to form a centrally located block or layer of photoresist 60 at a predetermined thickness (depth) and length to ultimately define a gate area 70 over and on the silicon nitride layer 50 and polysilicon layer 40 of the silicon substrate 10. It will be appreciated that the photopatterning step is to make the gate, source and drain definitions self-aligning relative to each other since the same mask is used at the same time.

Figure 4E:
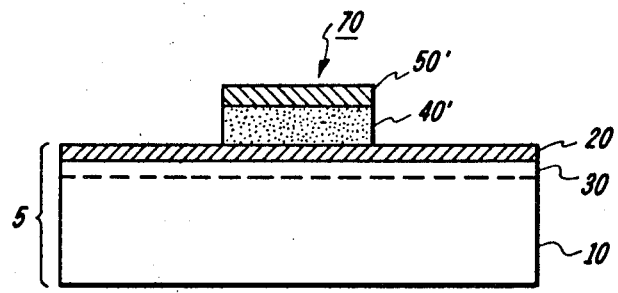
FIG. 4E is a profile view of the first silicon-nitride and polysilicon etching step five of the process used to fabricate the SASMESFET structure of FIG. 1.
Figure 4F:
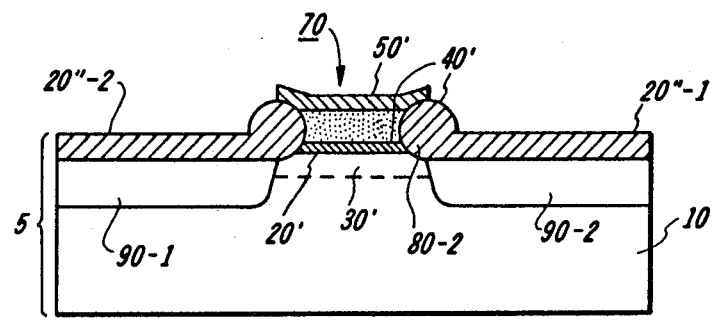
FIG. 4F is a profile view of the polysilicon oxidizing for bumper forming step six of the process used to fabricate the SASMESFET structure of FIG. 1.

In the fifth major process step known as first silicon nitride and polysilicon etching, as shown in FIG. 4E, for the Self-Aligned Schottky Metal Semi-Conductor Field Effect Transistor 5, the silicon nitride layer 50 and polysilicon layer 40 on the substrate 10 are etched away with $CF_4$ plasma where not covered by the photoresist layer 60 leaving a silicon nitride sublayer 50' and polysilicon sublayer 40' as a first and second substep. Finally, the photoresist layer 60 itself on the p doped silicon substrate 10 is completely removed or stripped away as a third substep.

In the sixth major process step known as polysilicon oxidizing for bumper forming, as shown in FIG. 4F, for the SASMESFET structure 5 as a first substep, insulators or oxide bumpers 80-1 and 80-2 of a silicon dioxide compound are formed or grown on either side of the gate area 70 to a predetermined thickness and width by the reaction of the polysilicon sublayer 40' and the ambient oxygen. Among the variables influencing the supra reaction are the duration of the reaction, the temperature during the reaction, the doping level of the polysilicon sublayer 40', and the thickness of the polysilicon sublayer 40'. The oxide bumpers 80-1 and 80-2 are relatively thicker than either the initial silicon dioxide layer 20 or the new silicon dioxide sublayer 20"-1 and 20"-2. The relatively rounded oxide bumpers 80-1 and 80-2 are proximate and adjacent to the relatively vertical sides of the gate area 70 and extending slightly in from the silicon nitride sublayer 50' and over the remaining channel implant layer 30 since that is proximate to where the thermal reaction takes place. Because of the differences in the oxide growth rate between heavily doped polysilicon layer 40' and the almost undoped silicon substrate 10, the width of the so called oxide bumper insulators 80-1 and 80-2 will be larger than the thickness of the oxidized silicon or initial silicon dioxide layer 20"-1 and 20"-2. It will also be appreciated that the portion of the initial silicon dioxide layer 20 designated as sublayer 20' and spatially directly under the silicon nitride sublayer is unaffected by the supra thermal conditions as is thus still relatively intact. Accordingly, the height of the initial silicon dioxide sublayer 20' is relatively level with the initial oxide sublayer 20"-1 and 20"-2, but not as deep insomuch as it was not oxidized into the substrate 10 when the former was.

Lastly, as a third substep, ion implantation with phosphorous (P) (at a degree of $6.0 \times 10^{15}$ cm$^{-2}$) is made through the initial silicon dioxide sublayer 20"-1 and 20"-2 and into the silicon substrate 10 to a predetermined depth on either side of the gate area 70 to form N+ source and N+ drain areas at 90-1 and 90-2 for N channel logic. It will be noted that the spatial designation of source and drain areas 90-1 and 90-2 is arbitrary and therefore reversible. Insomuch as the channel implant layer 30 has had either side abbreviated by the source and drain areas 90-1 and 90-2, it is redesignated the channel implant sublayer 30' spatially designated to be placed directly under the silicon nitride sublayer 50'. An additional optional substep three may be accomplished by oxidation of the top surface of the structure 5 particularly on the upper surface of the initial silicon dioxide layers 20"-1 and 20"-2, and also bumpers 80-1 and 80-2. A further substep four is accomplished by annealing.

Figure 4G:
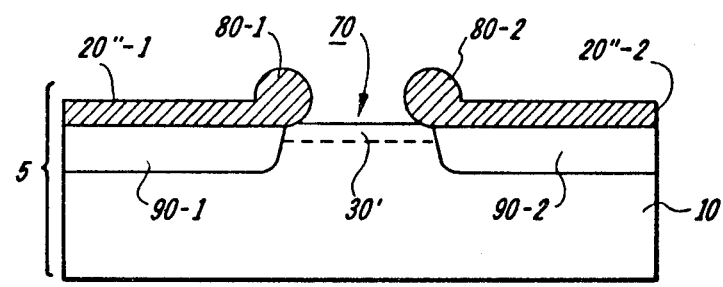
FIG. 4G is a profile view of the second silicon nitride and polysilicon etching step seven of the process used to fabricate the SASMESFET structure of FIG. 1.

In the seventh major process step known as second silicon nitride and polysilicon etching, as shown in FIG. 4G, for the preferred embodiment of the SASMESFET structure 5, the silicon nitride ($Si_3N_4$) sublayer 50' is etched away in the gate area 70 as a first substep. Next, the polysilicon sublayer 40' in the gate area 70 is etched away with $CF_4$ plasma as a second substep leaving a Schottky window. Finally initial silicon dioxide sublayer 20' is completely etched down to the substrate 10 comprising the channel implant sublayer 30' in the gate area 70.

Figure 4H:
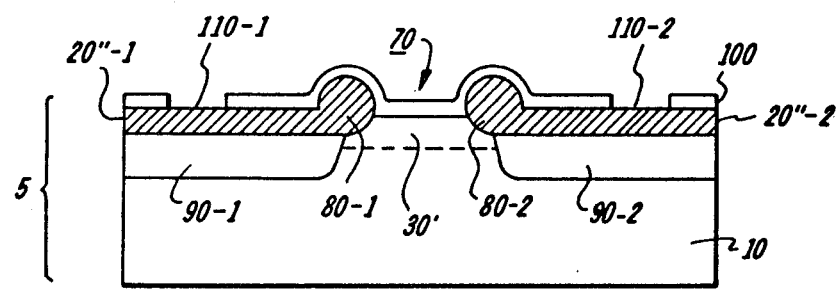
FIG. 4H is a profile view of the second photopattern defining step eight of the process used to fabricate the SASMESFET structure of FIG. 1.

In the eighth major process step known as second photopattern defining, as shown in FIG. 4H, for the fabrication of the preferred embodiment for the Self-Aligned Schottky Metal Semi-Conductor Field Effect Transistor (SASMESFET) Structure 5, electron beam lithography or conventional photopatterning is used leaving a photoresist layer 100 at a predetermined depth or thickness over the top of the SASMESFET structure 5 as the only substep including the initial silicon dioxide sublayers 20"-1 and 20"-2, oxide bumpers 80-1 and 80-2 and channel implant sublayer 30' of the silicon substrate 10, but excepting window/holes 110-1 and 110-2 in the photoresist layer 100 for subsequent use as contacts for source and drain and areas 90-1 and 90-2.

Figure 4I:
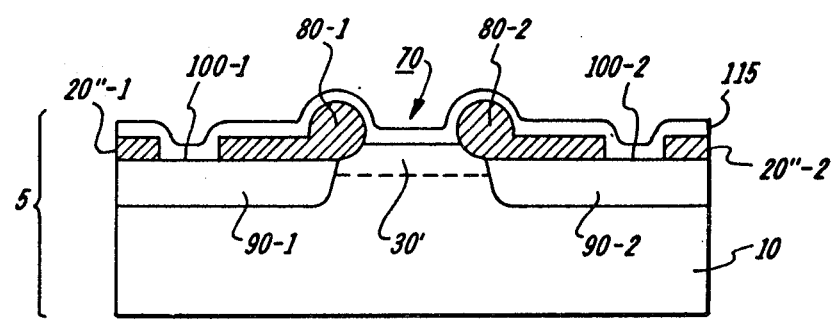
FIG. 4I is a profile view of the platinum depositing step nine of the process used to fabricate the SASMESFET structure of FIG. 1.

In the ninth major process step known as platinum depositing, as shown in FIG. 4I, for the fabrication of the SASMESFET structure 5, the windows 110-1 and 110-2 for the contacts are etched away to the substrate 10 level as a first substep. The photoresist layer 100 is then completely removed or stripped as a second substep. Finally, a layer of a proper metal such as platinum (Pt) (or Paladium (Pd)) is sputteringly deposited at a relatively predetermined uniform depth or thickness over the top surface of 300 angstroms of the structure 5, as a third substep.

Figure 4J:
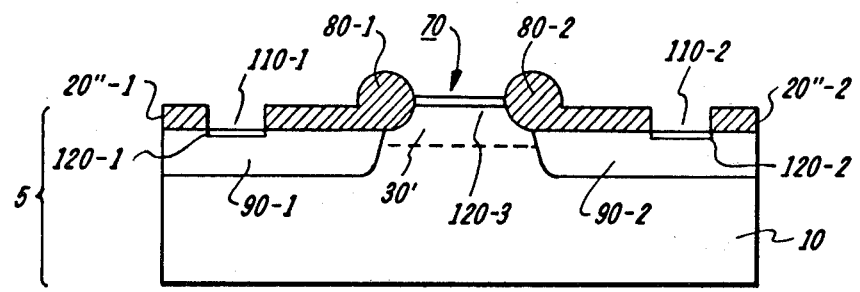
FIG. 4J is a profile view of the platinum-substrate alloy forming step ten of the process used to fabricate the SASMESFET structure of FIG. 1.

In the tenth major process step known as platinum-substrate alloy forming, as shown in FIG. 4J, for the self-aligned Schottky Metal Semi-Conductor Field Effect Transistor (SASMESFET) structure 5, thermal annealing or application thereby is made to the deposited layer 115 of platinum to a temperature sufficient to allow a portion of the platinum directly in contact with the substrate 10 to form the silicide alloy/compound layers 20-1, 2 and 3 of platinum-silicon or substrate alloy to a predetermined depth relatively less than the deposited platinum layer 115. It will be appreciated that layer 120-3 constitutes the Schottky barrier for the Schottky gate area 70. As an additional second substep, any platinum not formed into a platnium-substrate compound in layers 120-1 to 3 may be etched with an Aqua Region solution.

Figure 4K:
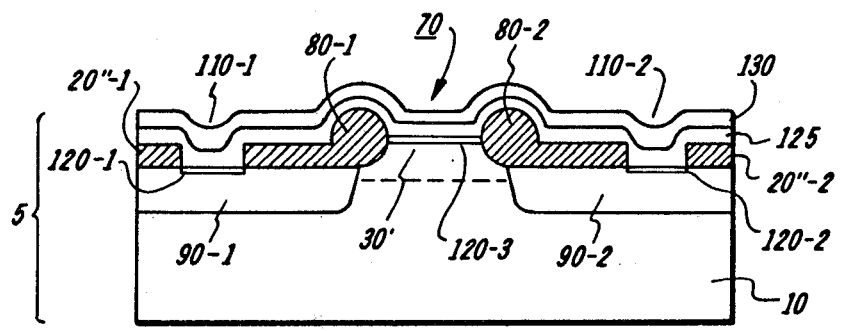
FIG. 4K is a profile view of the titanium-tungsten and aluminum depositing step eleven of the process used to fabricate the SASMESFET structure of FIG. 1.

In the eleventh major process step known as titanium-tungsten and aluminum depositing as shown in FIG. 4K for the Self-Aligned Schottky Metal Semi-Conductor Field Effect Transistor (SASMESFET) structure 5, an alloy of titanium and tungsten ($Ti_xW_x$) is sputter deposited (or evaporated) as a layer 125 completely covering and disposed on the top surface of the structure 5 at a predetermined depth or thickness of 2000 angstroms as a first substep. Next, a layer 130 of aluminum (Al) is completely sputter evaporated or deposited over the titanium-tungsten layer 125 to a predetermined depth on the substrate 10 as the second substep.

Figure 4L:
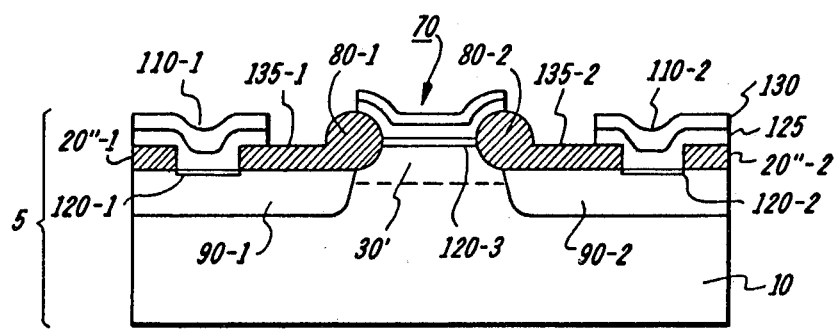
FIG. 4L is a profile view of the titanium-tungsten and aluminum etching step twelve of the process used to fabricate the SASMESFET structure of FIG. 1.

In the twelfth major process step known as titanium-tungsten and aluminum etching, as shown in FIG. 4L, for the Self-Aligned Schottky Metal Semi-Conductor Field Effect Transistor (SASMESFET) structure 5, photopatterning implemented by a metal mask is used to etch away the Al and TiW layers 125 and 130 in areas 135-1 and 2, as a first substep, that separates the source and drain windows 110-1 and 2 from the gate area 70 to obviate short circuiting thereby allowing the layers 125 and 130 above the windows 110-1 and 2, and area 70 to serve as conductive contacts for the source, drain and gate of the SASMESFET 5 respectively. As a second substep, sintering is used to further enhance the electrical contact between the TiW and Al layers 125 and 130 by heating in a nitrogen atmosphere.

As indicated supra, the advantage of the proposed fabrication process is simplicity, and also that due to the self-aligned Schottky gate and self-aligned source to gate and drain to gate separations, the value of the series resistance is relatively very small and the upper frequency limit therefore should be relatively high (per the equations effective transconductance equals maximum transconductance over one plus series resistance times maximum transconductance, and maximum frequency equals effective transconductance over transconductance capacitance, respectively). It will be appreciated that the relatively high operative speed or frequency dependent on a relatively low series resistance is the result of the relatively smaller structure geometries down to a VLSI level that can be obtained from the above process due to the relative ease of process control in forming the oxide bumpers or insulators 80-2 and 2 relative to the given prior art.

While the presently preferred embodiments of the invention and methods for performing them have been specifically described, it is distinctly understood that the invention may be otherwise variously emodied and used.

What is claimed is:

1. A high speed Schottky barrier field effect transistor, with low series resistance, comprising:
   a substrate of one conductivity type;
   a source region heavily doped to the other conductivity type;
   a drain region heavily doped to the other conductivity type;
   a channel region separating said source region and said drain region;
   Schottky barrier gate means forming a rectifying junction with a portion of said channel, said gate means providing, when properly biased, control of the current flow between said source region and said drain region; and
   an oxide layer with (1) first portions thereof covering portions of the external surface of said source and drain regions and (2) other portions thereof covering the portions of said channel between said source region and said barrier gate and between said drain region and said barrier gate, cross-sections of said other portions of said oxide layer having height and thickness dimensions greater than the thickness of said first portions of said oxide layer due to favored oxide growth at the edges of said barrier gate, whereby source-to-gate and gate-to-drain resistances are low which permit the transistor to operate at high frequencies.

2. A high speed Schottky barrier field effect transistor, with low series resistance, comprising:
   a substrate of one conductivity type;
   a source region heavily doped to the other conductivity type;
   a drain region heavily doped to the other conductivity type;
   a channel region separating said source region and said drain region;
   Schottky barrier gate means forming a rectifying junction with a portion of said channel, said gate means providing, when properly biased, control of the current flow between said source region and said drain region; and
   an oxide layer with (1) first portions thereof covering portions of the external surface of said source and drain regions and (2) other portions thereof covering the portions of said channel between said source region and said barrier gate and between said drain region and said barrier gate, cross-sections of said other portions of said oxide layer being generally curved with height and thickness dimensions greater than the thickness of said first portions of said oxide layer due to favored oxide growth at the edges of said barrier gate, whereby source-to-gate and gate-to-drain resistances are low which permit the transistor to operate at high frequencies.

3. A high speed Schottky barrier field effect transistor, with low series resistance, comprising:
   a substrate of one conductivity type;
   a source region heavily doped to the other conductivity type;
   a drain region heavily doped to the other conductivity type;

a channel region separating said source region and said drain region;

Schottky barrier gate means forming a rectifying junction with a portion of said channel, said gate means providing, when properly biased, control of the current flow between said source region and said drain region; and an oxide layer with (1) first portions thereof covering portions of the external surfaces of said source and drain regions and (2) other portions thereof covering the portions of said channel between said source region and said barrier gate and between said drain region and said barrier gate, cross-sections of said other portions of said oxide layer being generally circular with height and thickness dimensions greater than the thickness of said first portions of said oxide layer due to favored oxide growth at the edges of said barrier gate, whereby source-to-gate and gate-to-drain resistances are low which permit the transistor to operate at high frequencies.

* * * * *